(12) United States Patent
Lee et al.

(10) Patent No.: US 8,592,818 B2
(45) Date of Patent: Nov. 26, 2013

(54) ORGANIC LIGHT EMITTING DISPLAY DEVICE AND METHOD OF MANUFACTURING THE SAME

(75) Inventors: Yul-Kyu Lee, Yongin (KR); Sun Park, Yongin (KR); Kyung-Hoon Park, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 99 days.

(21) Appl. No.: 13/347,853

(22) Filed: Jan. 11, 2012

(65) Prior Publication Data

US 2013/0037817 A1     Feb. 14, 2013

(30) Foreign Application Priority Data

Aug. 9, 2011    (KR) .......................... 10-2011-0079150

(51) Int. Cl.
*H01L 29/12*      (2006.01)

(52) U.S. Cl.
USPC .................. 257/71; 257/89; 257/379; 438/35

(58) Field of Classification Search
USPC .................. 257/59, 71, 72, 89, 379, E51.022; 438/35
See application file for complete search history.

(56) References Cited

U.S. PATENT DOCUMENTS

2013/0037817 A1*  2/2013  Lee et al. .......................... 257/71

FOREIGN PATENT DOCUMENTS

| JP | 06-110070 | 4/1994 |
|----|-----------|--------|
| KR | 10-2007-0037763 A | 4/2007 |

* cited by examiner

*Primary Examiner* — Mark Prenty
(74) *Attorney, Agent, or Firm* — Lee & Morse, P.C.

(57) ABSTRACT

An organic light-emitting display device includes a plurality of sub-pixels each comprising a light-emitting portion, a thin film transistor (TFT), and a capacitor, each of the sub-pixels emitting a different color, wherein the capacitor of at least one of the plurality of sub-pixels extends into at least one adjacent one of the sub-pixels.

14 Claims, 10 Drawing Sheets

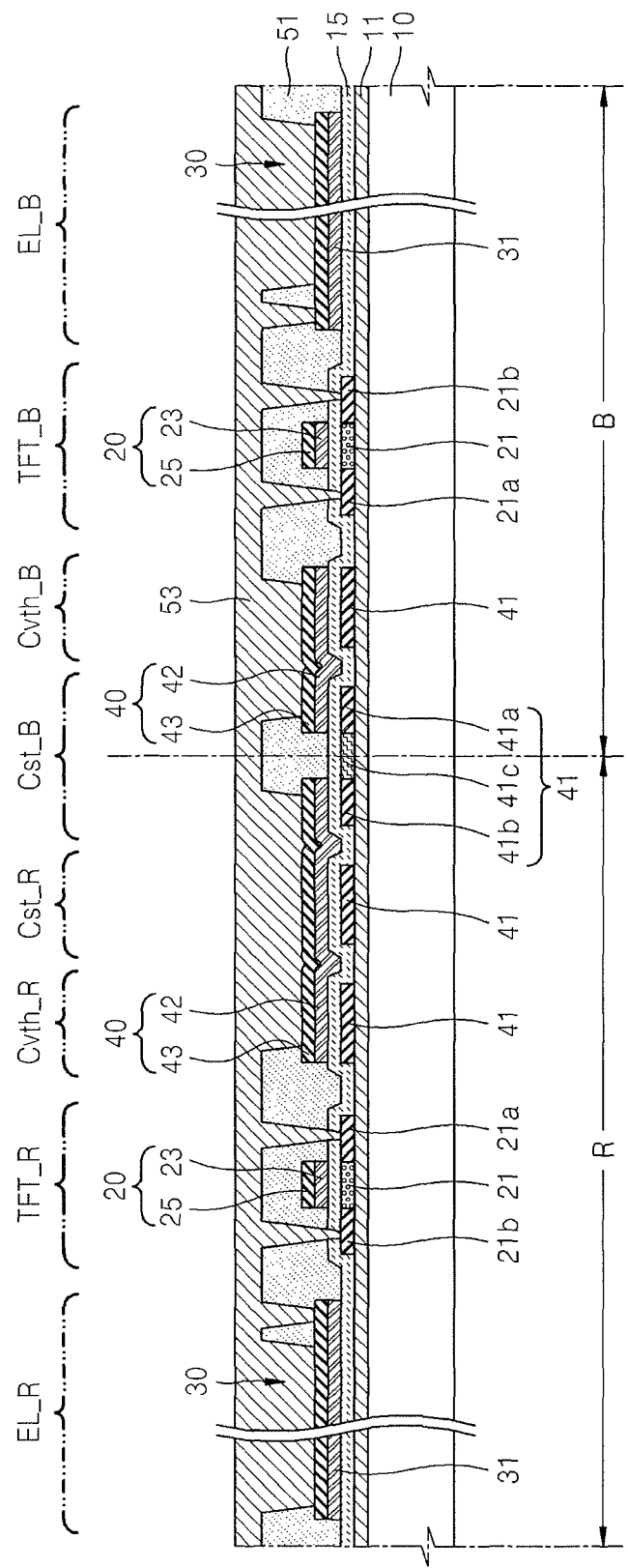

ORGANIC LIGHT EMITTING DISPLAY DEVICE AND METHOD OF MANUFACTURING THE SAME

CROSS-REFERENCE TO RELATED PATENT APPLICATION

This application claims the benefit of Korean Patent Application No. 10-2011-0079150, filed on Aug. 9, 2011, in the Korean Intellectual Property Office, the disclosure of which is incorporated herein in its entirety by reference.

BACKGROUND

1. Field

The present embodiments relate to an organic light-emitting display device.

2. Description of the Related Art

In general, a unit pixel of an organic light-emitting display device includes three sub-pixels, that is, red, green, and blue pixels. A desired color is realized by combining these three sub-pixels.

SUMMARY

According to an embodiment, there is provided an organic light-emitting display device, including a plurality of sub-pixels each comprising a light-emitting portion, a thin film transistor (TFT), and a capacitor, each of the sub-pixels emitting a different color, wherein the capacitor of at least one of the plurality of sub-pixels extends into at least one adjacent one of the sub-pixels.

The plurality of sub-pixels may include a red sub-pixel, a blue sub-pixel, and a green sub-pixel.

The capacitor of the blue sub-pixel may extend into at least one of the red sub-pixel and the green sub-pixel.

The capacitor of each of the plurality of sub-pixels may include a first electrode and a second electrode facing each other. The second electrode of the capacitor of each of the plurality of sub-pixels may be formed in each sub-pixel. The first electrode of the blue sub-pixel may extend into at least one of the red sub-pixel and the green sub-pixel.

The first electrode may include a polycrystalline silicon material. The second electrode includes at least one of ITO, IZO, ZnO, $In_2O_3$, IGO, and AZO.

The first electrode of the blue sub-pixel may include a first facing portion facing the second electrode of the blue sub-pixel, a second facing portion facing the second electrode of at least one of the red sub-pixel and the green sub-pixel, and a connection portion connecting the first facing portion and the second facing portion.

The light-emitting portion may include an organic emissive layer (EML), a pixel electrode, and an opposite electrode facing the pixel electrode, the EML being interposed between the pixel electrode and the opposite electrode. The TFT may include an active layer formed on a same plane as and formed of a same material as the first electrode, a gate electrode formed on a same plane as and formed of a same material as the second electrode, and source and drain electrodes connecting the active layer and the pixel electrode.

According to an embodiment, there is provided a method of manufacturing an organic light-emitting display device, the method including forming a plurality of sub-pixels, each including a light-emitting portion, a TFT, and a capacitor, each of the sub-pixels being configured to emit a different color, wherein the capacitor of at least one of the plurality of sub-pixels is formed to extend into at least one adjacent one of the sub-pixels.

The plurality of sub-pixels may include a red sub-pixel, a blue sub-pixel, and a green sub-pixel.

The capacitor of the blue sub-pixel may be formed to extend into at least one of the red sub-pixel and the green sub-pixel.

The method may further include forming the capacitor of each of the plurality of sub-pixels to include a first electrode and a second electrode facing each other. The second electrode of the capacitor of each of the plurality of sub-pixels may be formed in each sub-pixel. The first electrode of the blue sub-pixel may be formed to extend into at least one of the red sub-pixel and the green sub-pixel.

The first electrode may be formed of a polycrystalline silicon material. The second electrode may include at least one of ITO, IZO, ZnO, $In_2O_3$, IGO, and AZO.

The method may further include forming the first electrode of the blue sub-pixel to include a first facing portion facing the second electrode of the blue sub-pixel, a second facing portion facing the second electrode of at least one of the red sub-pixel and the green sub-pixel, and a connection portion connecting the first facing portion and the second facing portion.

The method may further include forming an active layer of a same material as the first electrode on a same plane as the first electrode, forming a gate electrode of a same material as the second electrode on a same plane as the second electrode, and forming source and drain electrodes connecting the active layer and the pixel electrode.

BRIEF DESCRIPTION OF THE DRAWINGS

FIGS. 3A through 3H are cross-sectional views of a process of stacking the R and B sub-pixels of FIG. 2.

DETAILED DESCRIPTION

Figure 1:
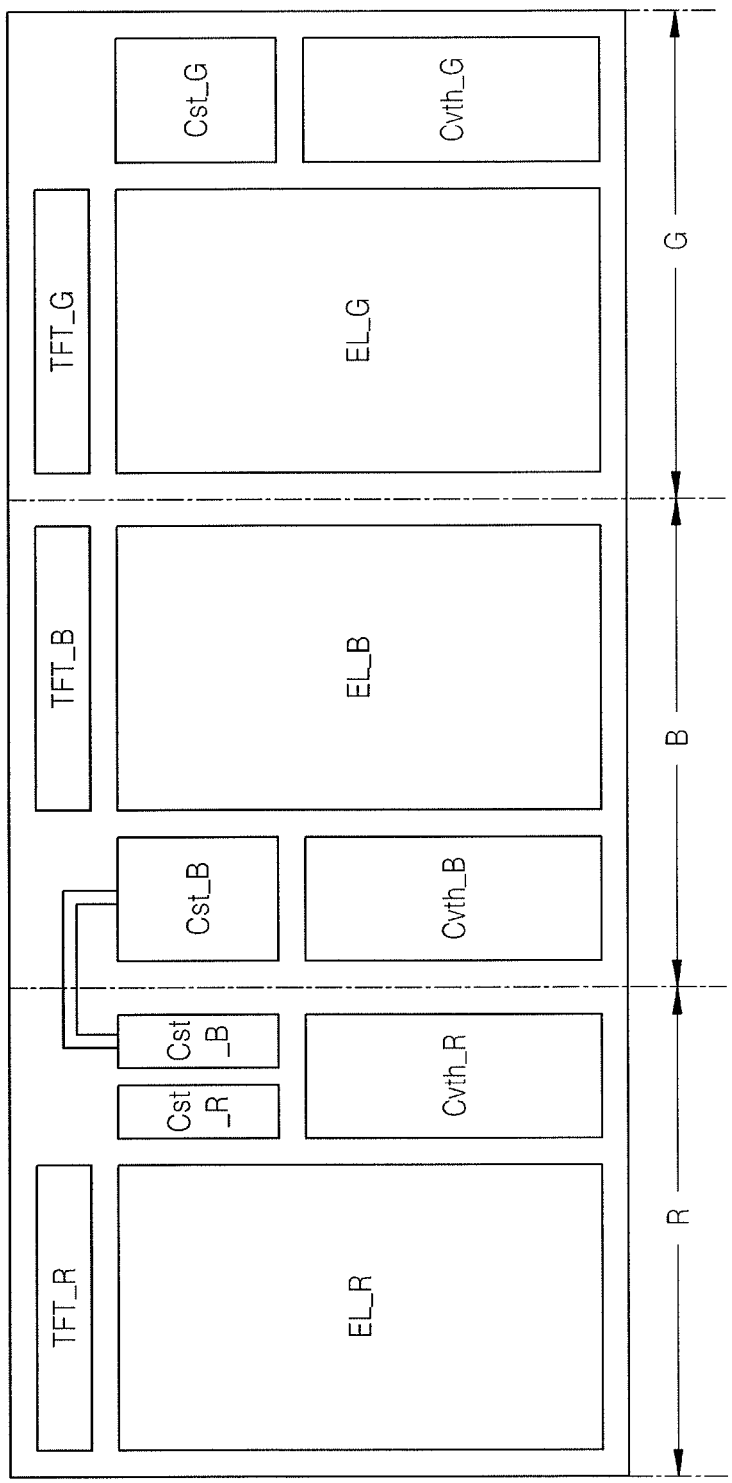
FIG. 1 is a schematic plan view of a unit pixel including red (R), green (G), and blue (B) sub-pixels of an organic light-emitting display device according to an embodiment.

Hereinafter, embodiments are described in detail by explaining exemplary embodiments thereof with reference to the attached drawings. Like reference numerals in the drawings denote like elements.

In the drawings, the thicknesses or size of layers may be exaggerated for clarity. In the description, when it is described that a layer is disposed on another layer, the layer may be directly disposed on the other layer or a third layer may be interposed therebetween.

Figure 2:
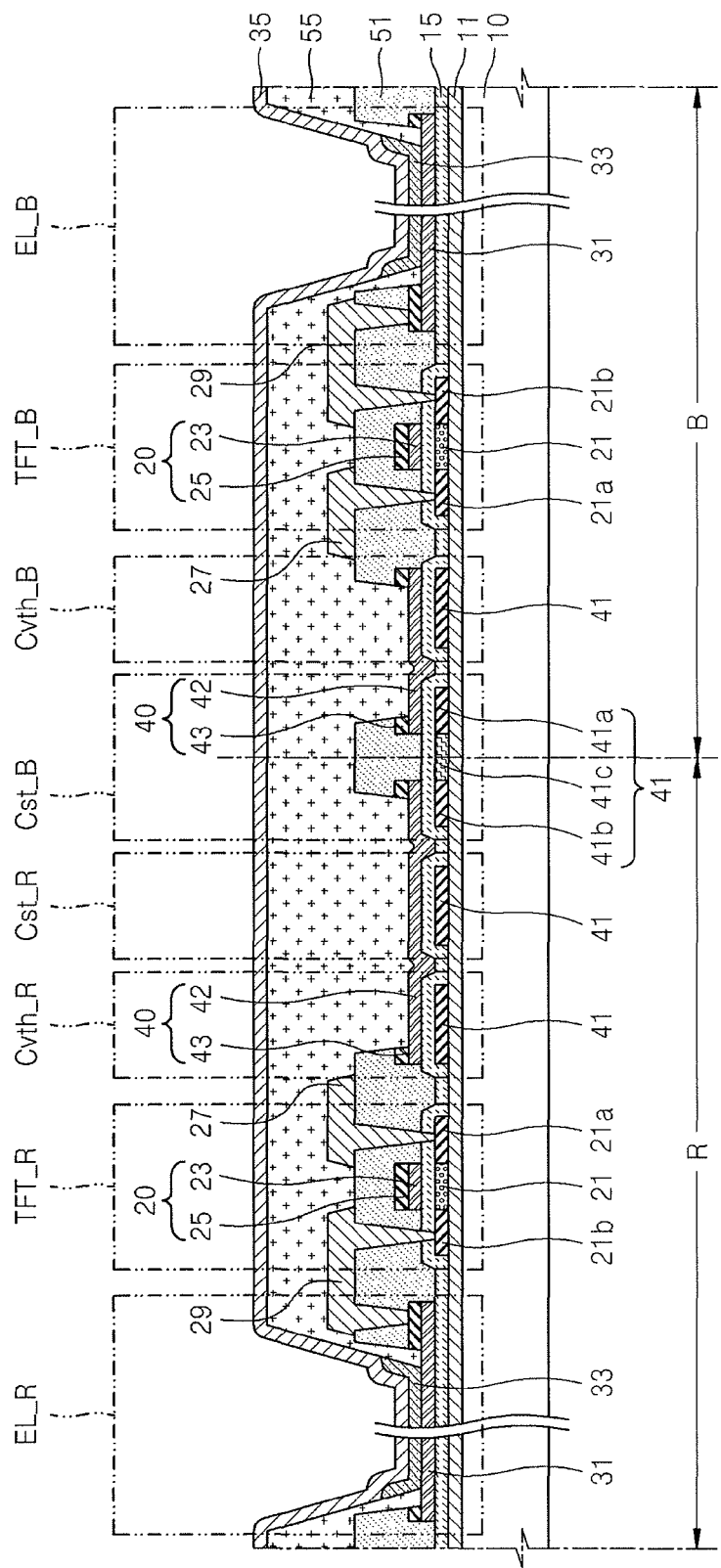
FIG. 2 is a cross-sectional view of the R and B sub-pixels of FIG. 1.

FIG. 1 is a schematic plan view of a unit pixel of an organic light-emitting display device according to an embodiment. FIG. 2 is a cross-sectional view of a main portion of the unit pixel of FIG. 1. The unit pixel may include three-color sub-pixels, namely, a red (R) sub-pixel, a green (G) sub-pixel, and a blue (B) sub-pixel. Unit pixels each including the three-sub-pixels may be repeatedly arranged in column and row directions in the organic light-emitting display device.

Referring to FIG. 1, the organic light-emitting display device may include the three-color sub-pixels including the red (R) sub-pixel, the green (G) sub-pixel, and the blue (B) sub-pixel as elements of the unit pixel. Each of the red (R) sub-pixel, the green (G) sub-pixel, and the blue (B) sub-pixel may include light-emitting portions EL_R, EL_B, and EL_G, thin film transistors (TFTs) TFT_R, TFT_B, and TFT_G, and capacitors Cst_R, Cst_B, Cst_G, Cvth_R, Cvth_B, and Cvth_G.

The capacitors Cst_R, Cst_B, and Cst_G may be storage capacitors for storing data signals when the data signals are applied to the TFTs TFT_R, TFT_B, and TFT_G. The capacitors Cvth_R, Cvth_B, and Cvth_G may be compensation capacitors for compensating for non-uniformity of a threshold voltage. The storage capacitors Cst_R, Cst_B, and Cst_G compensate for light-emitting efficiency. The blue (B) sub-pixel may have the lowest light-emitting efficiency, and thus the storage capacitor Cst_B of the blue (B) sub-pixel for compensating for the lowest light-emitting efficiency may be necessarily greater than the storage capacitors Cst_R and Cst_G of the red (R) sub-pixel and the green (G) sub-pixel.

The storage capacitor Cst_B of the blue (B) sub-pixel may extend into the red (R) sub-pixel in the present embodiment. The storage capacitors Cst_R and Cst_G of the red (R) sub-pixel and the green (G) sub-pixel may be smaller than the storage capacitor Cst_B of the blue (B) sub-pixel. Accordingly, the red (R) sub-pixel or the green (G) sub-pixel may be partially used to form the storage capacitor Cst_B of the blue (B) sub-pixel. Although the storage capacitor Cst_B of the blue (B) sub-pixel extends into the red (R) sub-pixel in the present embodiment, the storage capacitor Cst_B of the blue (B) sub-pixel may extend into the green (G) sub-pixel.

An area for forming the storage capacitor Cst_B may be reduced in the blue (B) sub-pixel, thereby increasing an area of the light-emitting portion EL_B, and accordingly enhancing an aperture ratio. Furthermore, unnecessarily large spaces for the storage capacitors Cst_R and Cst_G of the red (R) sub-pixel and the green (G) sub-pixel due to sizes of the blue (B) sub-pixel and the light-emitting portions EL_R, EL_B, and EL_G may be reduced.

FIG. 2 is a cross-sectional view of the red (R) sub-pixel and the blue (B) sub-pixel into which the storage capacitor Cst_B of the blue (B) sub-pixel extends. For reference, the green (G) sub-pixel in the present embodiment may have the same structure as the red (R) sub-pixel, except without the storage capacitor Cst_B of the blue (B) sub-pixel extending thereinto. The cross-sectional view of FIG. 2 shows all the light-emitting portions EL_R and EL_B, the TFTs TFT_R and TFT_B, and the capacitors Cst_R, Cst_B, Cvth_R, and Cvth_B. Accordingly, FIG. 2 does not represent the organic light-emitting display device of FIG. 1 taken in a rectilinear direction, such as a horizontal direction or a perpendicular direction. Therefore, the sizes of the red (R) sub-pixel and the blue (B) sub-pixel of FIG. 2 may be slightly different from those shown in FIG. 1.

The TFTs TFT_R and TFT_B may include an active layer 21, a gate electrode 20, and source and drain electrodes 27 and 29. The gate electrode 20 may include a gate bottom electrode 23 and a gate top electrode 25. The gate bottom electrode 23 may be formed of a transparent conductive material. A first insulating layer 15 may be disposed between the gate electrode 20 and the active layer 21 to insulate therebetween. Source and drain regions 21a and 21b into which high density impurities are injected may be formed in both edges of the active layer 21, and may be respectively connected to the source and drain electrodes 27 and 29.

The light-emitting portions EL_R and EL_B may include a pixel electrode 31 connected to the source and drain electrodes 27 and 29 of the TFTs TFT_R and TFT_B, an opposite electrode 35 facing the pixel electrode 31, and an intermediate layer 33 disposed between the pixel electrode 31 and the opposite electrode 35. The pixel electrode 31 may be formed of a transparent conductive material such as ITO, and may be formed simultaneously with the formation of the gate electrode 20 of the TFTs TFT_R and TFT_B.

The capacitors Cst_R, Cst_B, Cvth_R, and Cvth_B may include a first electrode 41 and second electrodes 42 and 43, and the first insulating layer 15 may be disposed therebetween. The second electrodes 42 and 43 of the capacitors Cst_R, Cst_B, Cvth_R, and Cvth_B may be formed simultaneously with the formation of the gate electrode 20 of the TFTs TFT_R and TFT_B and the pixel electrode 31 of the light-emitting portions EL_R and EL_B.

In the structure of the storage capacitor Cst_B of the blue (B) sub-pixel, the first electrode 41 may extend even into the red (R) sub-pixel. That is, the first electrode 41 of the storage capacitor Cst_B may be disposed in the blue (B) sub-pixel and may include a first facing portion 41a facing the second electrodes 42 and 43 of the blue (B) sub-pixel. and the first electrode 41 of the storage capacitor Cst_B may also be disposed in the red (R) sub-pixel and may include a second facing portion 41b facing the second electrodes 42 and 43 of the red (R) sub-pixel, and a connection portion 41c connecting the first facing portion 41a and the second facing portion 41b. Therefore, although the second electrodes 42 and 43 may be formed in the red (R) sub-pixel and the blue (B) sub-pixel, respectively, the first electrode 41 of the blue (B) sub-pixel extends into the red (R) sub-pixel and functions as the storage capacitor Cst_B. Therefore, the storage capacitor Cst_B of the blue (B) sub-pixel may be increased in size, and the area of the light-emitting portion EL_B may also be increased.

FIGS. 3A through 3H are cross-sectional views of a process of manufacturing the organic light-emitting display device of FIG. 2.

Figure 3A:
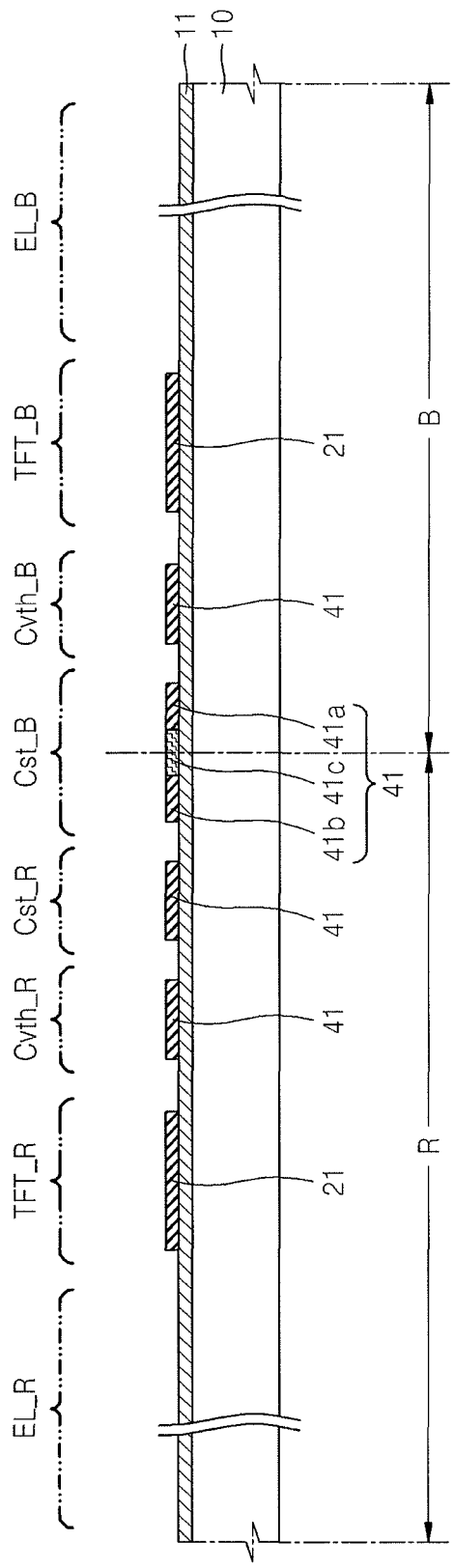

Referring to FIG. 3A, a buffer layer 11 that blocks the substrate 10 from flatness and penetration of impure elements may be formed on a top portion of the substrate 10.

The substrate 10 may be formed of a transparent material such as glass having $SiO_2$ as a main component. The substrate 10 may also be formed of various other materials such as a transparent plastic material or a metal material.

The active layer 21 of the TFTs TFT_R and TFT_B and the first electrode 41 of the capacitors Cst_R, Cst_B, Cvth_R, and Cvth_B may be formed on a top portion of the buffer layer 11. A mask process using a first mask (not shown) may be used to pattern the active layer 21 of the TFTs TFT_R and TFT_B and the first electrode 41 of the capacitors Cst_R, Cst_B, Cvth_R, and Cvth_B. The active layer 21 and the first electrode 41 may be formed of a polycrystalline silicon material.

The first electrode 41 of the storage capacitor Cst_B may include the first facing portion 41a and the second facing portion 41b and the connection portion 41c such that the first electrode 41 extends into the red (R) sub-pixel and the blue (B) sub-pixel.

Figure 3B:
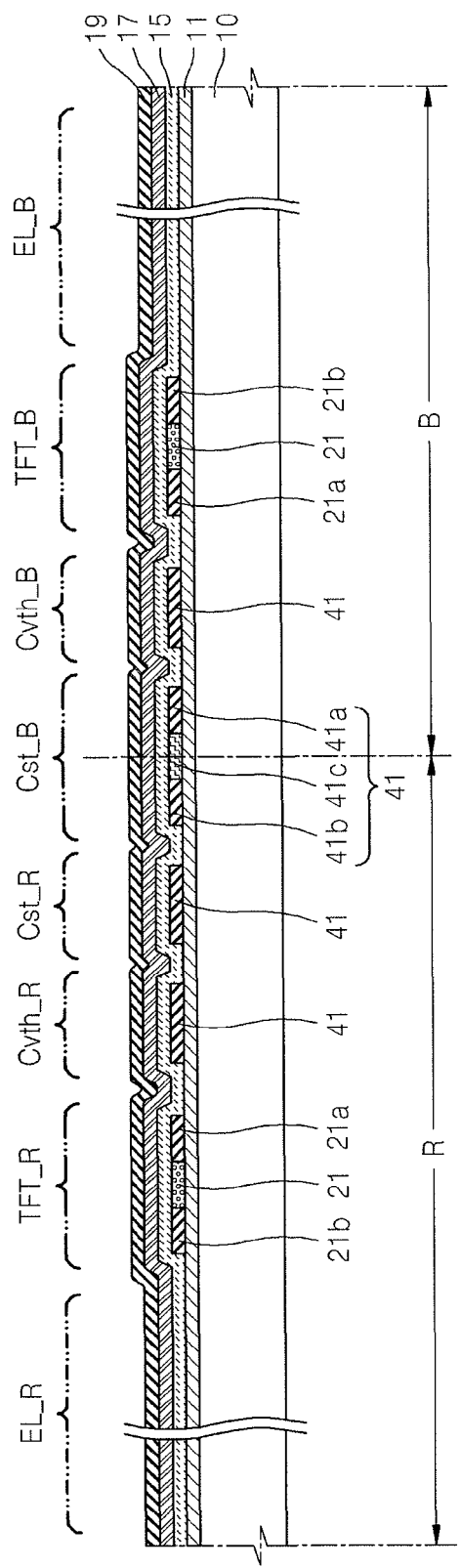

Referring to FIG. 3B, the first insulating layer 15, the first conductive layer 17, and the second conductive layer 19 may be sequentially deposited on a whole surface of the substrate 10 in which the active layer 21 and the first electrode 41 are formed.

The first insulating layer 15 may be deposited as an inorganic insulating layer such as $SiN_x$ or $SiO_x$ using various deposition methods such as a plasma-enhanced chemical vapor deposition (PECVD) method, an atmospheric pressure CVD (APCVD) method, a low pressure CVD method, etc. The first insulating layer 15 may be disposed between the active layer 21 and the gate electrode 20 of the TFTs TFT_R and TFT_B, The first insulating layer 15 may function as a gate insulating layer, and also as a dielectric layer between the first electrode 41 and the second electrodes 42 and 43.

The first conductive layer 17 may include at least one transparent material such as ITO, IZO, ZnO, $In_2O_3$, IGO, and AZO. The first conductive layer 17 may be patterned subsequently into the pixel electrode 31, the gate bottom electrode 23, and the second electrode 42.

The second conductive layer 19 may include at least one of Ag, Mg, Al, Pt, Pd, Au, Ni, Nd, Ir, Cr, Li, Ca, Mo, Ti, W, MoW, and Al/Cu. The second conductive layer 19 may be patterned subsequently into the gate top electrode 25 and the second electrode 43.

Figure 3C:
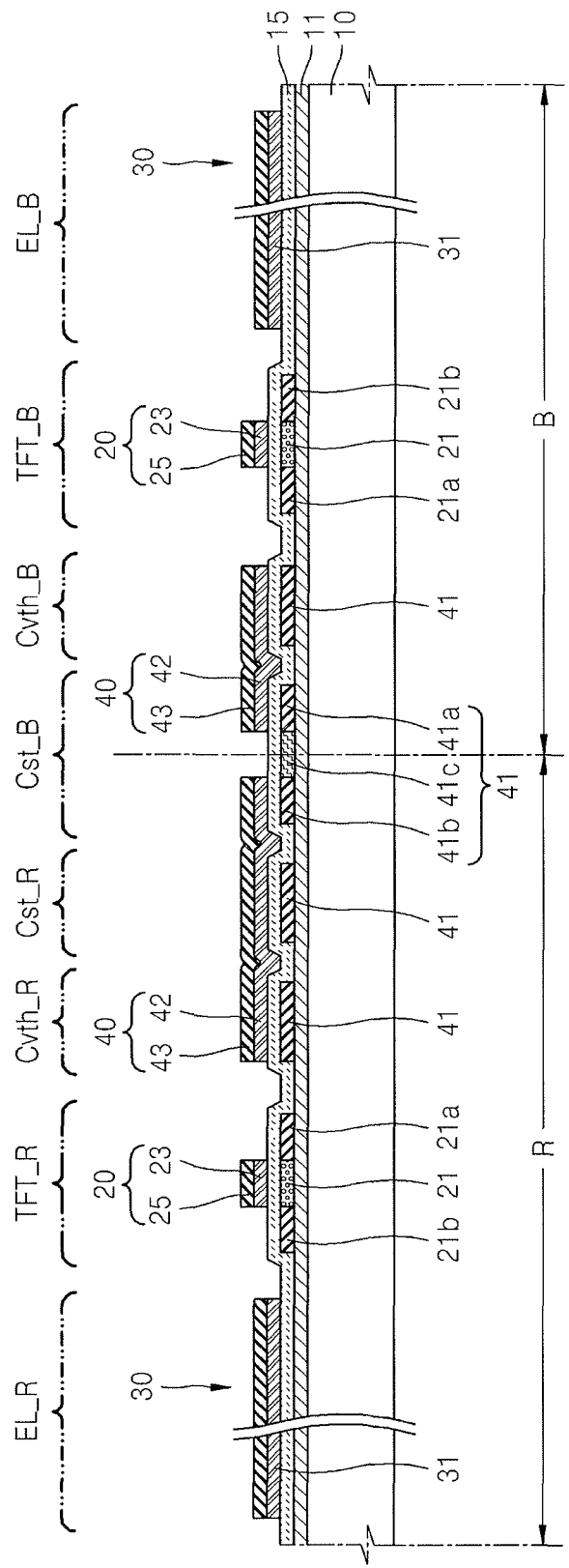

Referring to FIG. 3C, the gate electrode 20 and electrode patterns 30 and 40 may be formed on the substrate 10.

The first conductive layer 17 and the second conductive layer 19, which are sequentially deposited in an entire surface of the substrate 10, may be patterned using a mask process using a second mask (not shown).

The gate electrode 20 may be formed on the top portion of the active layer 21 in the TFTs TFT_R and TFT_B. The gate electrode 20 may include the gate bottom electrode 23, which is a part of the first conductive layer 17, and the gate top electrode 25, which is a part of the second conductive layer 19.

The electrode pattern 30 for forming the pixel electrode 41 may be formed later in the light-emitting portions EL_R and EL_B. The electrode pattern 40 for forming the second electrodes 42 and 43 of the capacitors Cst_R, Cst_B, Cvth_R, and Cvth_B may be formed in the top portion of the first electrode 41.

The gate electrode 20 may correspond to the center of the active layer 21. The source and drain regions 21a and 21b and a channel region therebetween in edges of the active layer 21 corresponding to both sides of the gate electrode 20 may be formed by doping the active layer 21 with n type or p type impurities using the gate electrode 20 as a mask.

Figure 3D:
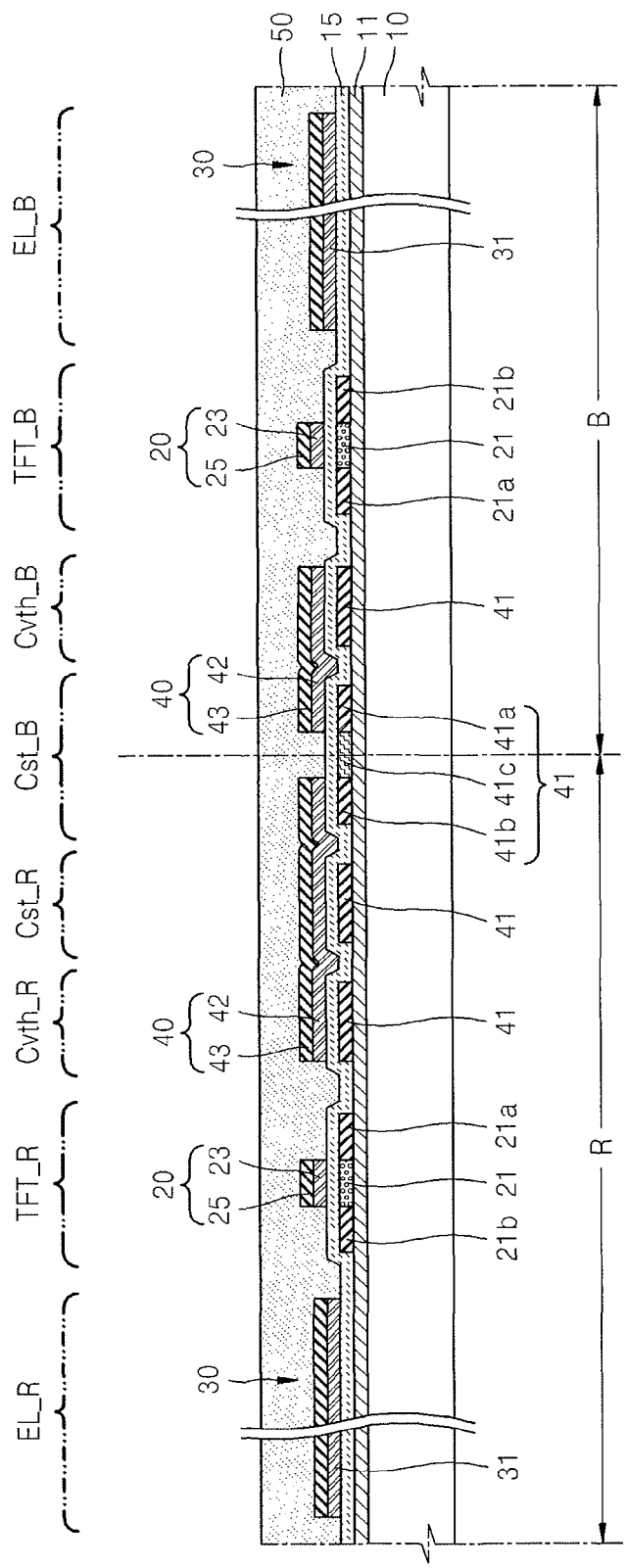

A second insulating layer 50 may be deposited on the entire surface of the substrate 10 in FIG. 3D.

The second insulating layer 50 may be formed using at least one organic insulating material selected from polyimide, polyamide, acrylic resin, benzocyclobutene, and phenolic resin, and by using a method such as a spin coating method. The second insulating layer 50 may be formed to have a sufficient thickness, for example, to have a thickness that is greater than a thickness of the first insulating layer 15, so that the second insulating layer 50 may function as an interlayer insulating layer between the gate electrode 20 and the source and drain electrodes 27 and 29. The second insulating layer 50 may be formed of not only the above-described organic insulating material but also of an inorganic insulating material like the first insulating layer 15, or by alternately including an organic insulating material and an inorganic insulating material.

Figure 3E:
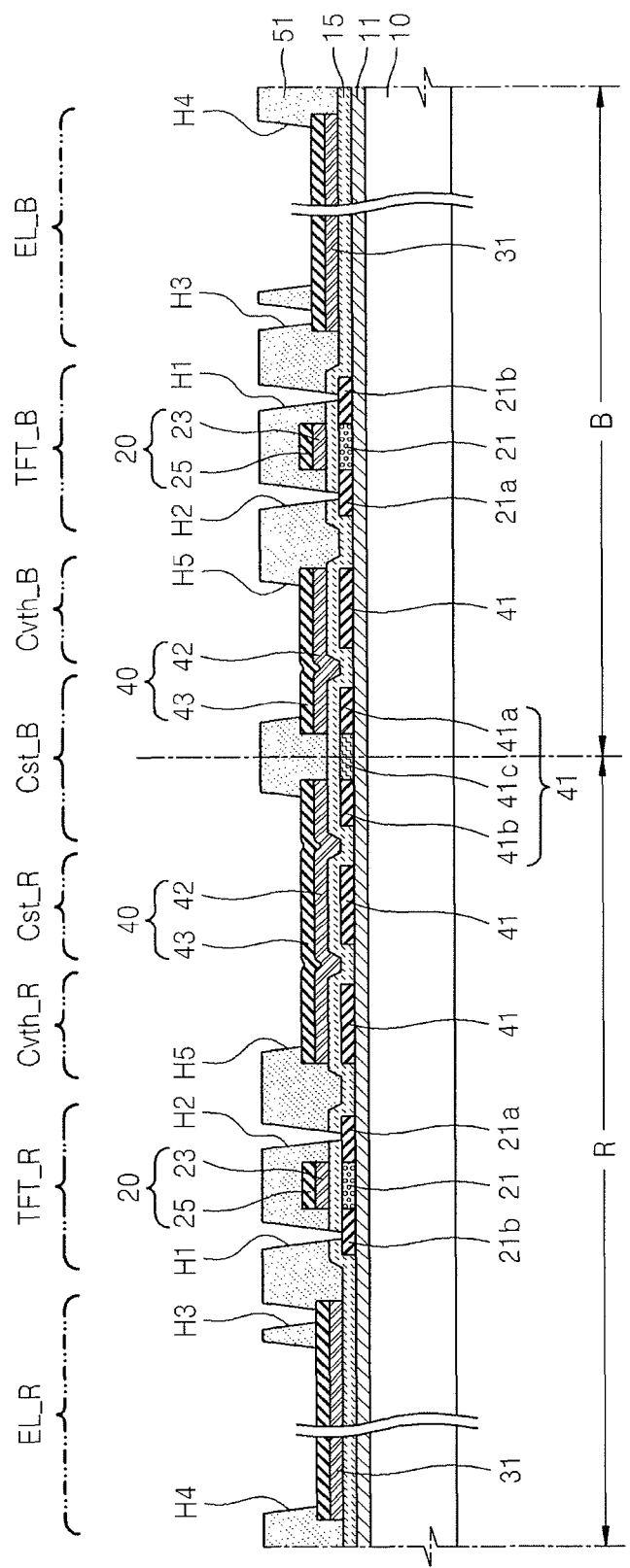

Referring to FIG. 3E, an interlayer insulating layer 51 including openings H1, H2, H3, H4, and H5 that expose the electrode patterns 30 and 40 and the source and drain regions 21a and 21b may be formed.

The second insulating layer 50 may be patterned using a mask operation using a third mask (not shown) to form the openings H1, H2, H3, H4, and H5.

The openings H1 and H2 may expose portions of the source and drain regions 21a and 21b, the openings H3 and H4 may expose a portion of the second conductive layer 19 that corresponds to a top portion of the electrode pattern 30 of the light-emitting portions EL_R and EL_B. The opening H5 may expose a portion of the second conductive layer 19 that corresponds to a top portion of the electrode pattern 40.

Referring to FIG. 3F, a third conductive layer 53 may be deposited on the entire surface of the first substrate 10 to cover the interlayer insulating layer 51.

The third conductive layer 53 may be formed of the same material of the first conductive layer 17 or the second conductive layer 19 described above. The third conductive layer 53 may also be formed of other conductive materials. The conductive material of the third conductive layer 53 may be deposited to have a sufficient thickness so that the openings H1, H2, H3, H4, and H5 may be filled.

Figure 3G:
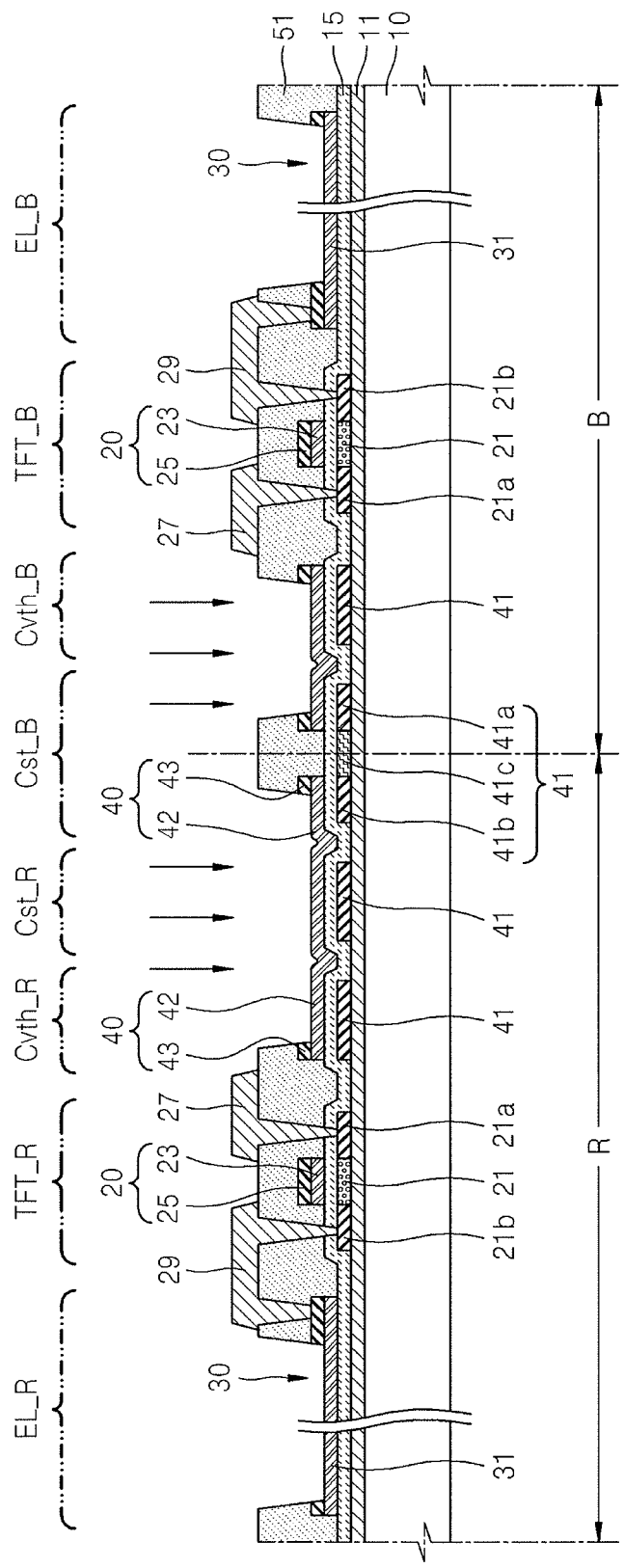

Referring to FIG. 3G, the third conductive layer 53 may be patterned to form the source and drain electrodes 27 and 29. For example, the third conductive layer 53 may be patterned in a mask operation using a fourth mask (not shown) to form the source and drain electrodes 27 and 29. The pixel electrode 31 and the second electrodes 42 and 43 may be formed by etching.

One of the source and drain electrodes 27 and 29, for example, the drain electrode 29 as shown in FIG. 3G, may be formed to contact the pixel electrode 31 through the opening H3 of an edge portion of the second conductive layer 19, which is the top portion of the electrode pattern 30 in which the pixel electrode 31 is to be formed.

After the source and drain electrodes 27 and 29 are formed, the pixel electrode 31 and the second electrodes 42 and 43 may also be formed by etching. The pixel electrode 31 may also be formed by removing the second conductive layer 19 exposed through the opening H4 from the electrode pattern 30 in the light-emitting portions EL_R and EL_B.

A portion of the second conductive layer 19 exposed through the opening H15 may be removed from the electrode pattern 40 to form the second electrodes 42 and 43 in the capacitors Cst_R, Cst_B, Cvth_R, and Cvth_B. In this regard, the second electrode 42 formed as the first conductive layer 17 may remain, whereas a portion of the second electrode 43 formed as the second conductive layer 19 may be removed in such a way that the second electrode 42 is exposed through another portion of the second electrode 43.

Thereafter, the first electrode 41 may be doped by injecting n-type or p-type impurities through the opening H5. The impurities to be injected when doping the first electrode 41 may be the same as or different from those used in doping the active layer 21. In the structures of the capacitors Cst_R, Cst_B, Cvth_R, and Cvth_B, as described above, the storage capacitor Cst_B of the blue (B) sub-pixel may extend even into the red (R) sub-pixel, thereby achieving a sufficient electrostatic capacity although the area of the light-emitting portion EL_B is increased. That is, an aperture ratio may be enhanced.

Figure 3H:
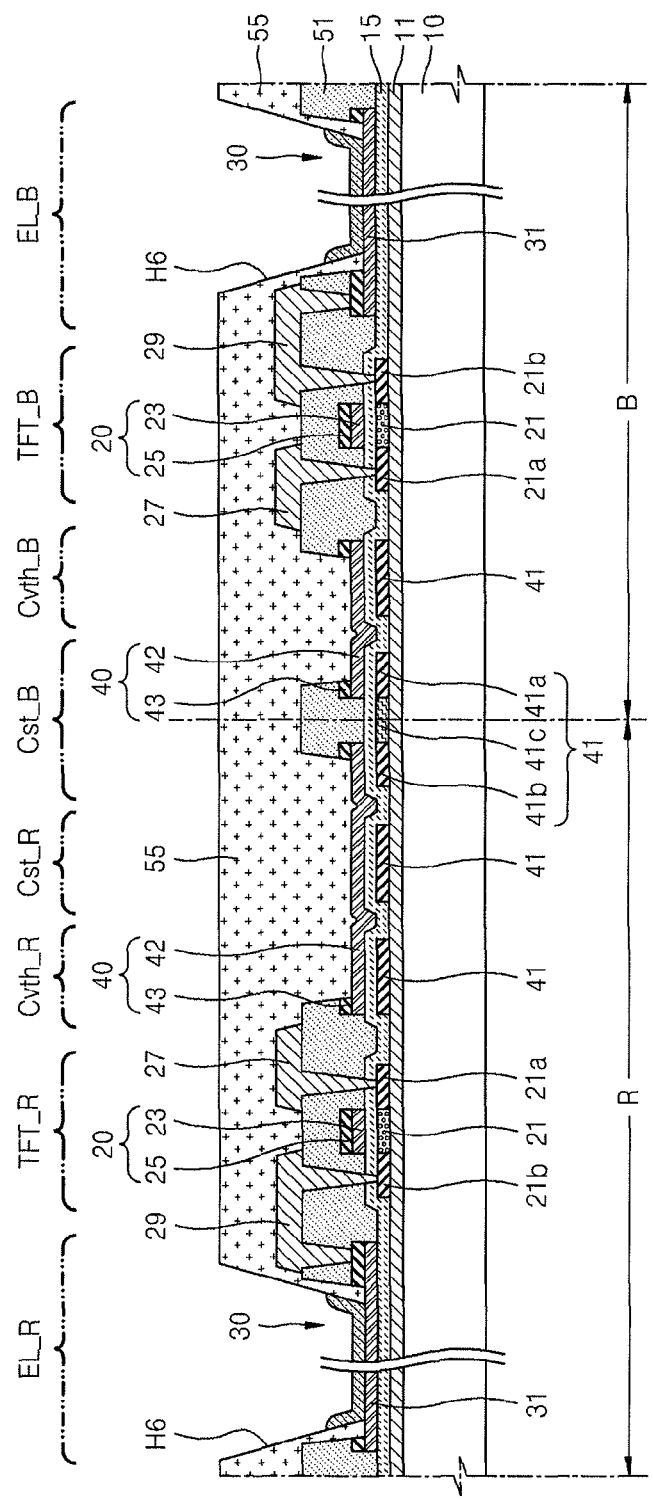

Referring to FIG. 3H, a pixel-defining layer 55 may be formed on the substrate 10.

The pixel-defining layer 55 may be deposited on the entire surface of the substrate 10 on which the pixel electrode 31, the source and drain electrodes 27 and 29, and the second electrodes 42 and 43 are formed.

The pixel-defining layer 55 may be formed using at least one organic insulating material selected from polyimide, polyamide, acrylic resin, benzocyclobutene, and phenolic resin, and by using a method such as a spin coating method. A third insulating layer 55a may be formed of not only the above-described organic insulation materials but also of inorganic insulating materials selected from the group consisting of $SiO_2$, $SiN_x$, $Al_2O_3$, $CuO_x$, $Tb_4O_7$, $Y_2O_3$, $Nb_2O_5$, and $Pr_2O_3$. Also, the pixel-defining layer 55 may be formed in a multi-layer structure in which an organic insulating material and an inorganic insulating material are alternately formed.

The pixel-defining layer 55 may be patterned by using a mask operation in which a fifth mask (not shown) is used to form an opening H6 that exposes a center portion of the pixel electrode 31 and thus defines pixels.

Then, as illustrated in FIG. 2, the intermediate layer 33 including an organic emissive layer and the opposite electrode 35 may be formed in the opening H6 that exposes the pixel electrode 31.

The intermediate layer 33 may be formed in a stack structure in which at least one of a plurality of functional layers such as an organic emissive layer (EML), a hole transport layer (HTL), a hole injection layer (HIL), an electron transport layer (ETL), and an electron injection layer (EIL) are stacked in a single-layer structure or a multi-layer structure.

The intermediate layer 33 may include low-molecular weight organic materials or polymer organic materials.

When the intermediate layer 33 is formed of a low-molecular organic material, the intermediate layer 33 may include a HTL and a HIL next to the organic emissive layer in a direction towards the pixel electrode 31, and an ETL and an EIL in a direction towards the opposite electrode 35. Also, other layers may be stacked as desired. Examples of organic materials include copper phthalocyanine (CuPc), N,N'-di(naphthalene-1-yl)-N,N'-diphenyl-benzidine (NPB), and tris-8-hydroxyquinoline aluminum (Alq3).

When the intermediate layer 33 is formed of a polymer organic material, the intermediate layer 33 may include only a HTL from the organic emissive layer in a direction toward the pixel electrode 31. The HTL may be formed on the pixel electrode 31 using poly-(3,4)-ethylene-dihydroxy thiophene (PEDOT) or polyaniline (PANI) by using an inkjet printing method or a spin coating method. Examples of organic materials that may be used here include polymer organic materials such as polyphenylene vinylene (PPV) and polyfluorene; the intermediate layer 33 may be formed by using methods such as an inkjet printing method, a spin coating method, or a laser induced thermal imaging (LITI) method.

The opposite electrode 35 may be deposited on the entire surface of the substrate 10 as a common electrode. In the organic light-emitting display device according to the current embodiment, the pixel electrode 31 may be used as an anode and the opposite electrode 35 may be used as a cathode. However, the polarities of the electrodes may also be switched.

When the organic light-emitting display device is a bottom emission type display device in which an image is formed in a direction towards the substrate 10, the pixel electrode 31 may be a transparent electrode and the opposite electrode 35 may be a reflective electrode. The reflective electrode may be formed by depositing a thin layer using a metal having a small work function, such as Ag, Mg, Al, Pt, Pd, Au, Ni, Nd, Ir, Cr, Li, Ca, LiF/Ca, LiF/Al, or a combination of these.

A sealing member (not shown) and a moisture absorbent (not shown) for protecting the organic EML from external moisture or oxygen may be further formed on the opposite electrode 35.

In each mask operation of the method of manufacturing the above-described organic light-emitting display device, the stacked layers may be removed using a dry etching method or a wet etching method.

In addition, while only one TFT and one capacitor are illustrated in the drawings, for convenience of description, it is to be understood that a plurality of TFTs and a plurality of capacitors may be included as desired.

By way of summation and review, a sub-pixel typically may include a thin film transistor (TFT), a capacitor, and a light-emitting portion connected to the thin film transistor and the capacitor. The light-emitting portion receives an appropriate driving signal from the TFT and the capacitor, emits light, and forms a desired color.

The blue sub-pixel typically has the worst light-emitting efficiency among red, green, and blue sub-pixels. To compensate for the poor light-emitting efficiency, the blue sub-pixel typically has the largest capacitor. Sizes of the red and green sub-pixels are typically determined in accordance with a size of the blue sub-pixel having the largest capacitor.

However, if the sizes of the red and green sub-pixels are determined in accordance with the size of the blue sub-pixel, the red and green sub-pixels have unnecessary spaces. That is, if the capacitor of the blue sub-pixel is relatively the largest so as to compensate for the light-emitting efficiency, the capacitor occupies a major portion of the blue sub-pixel, whereas capacitors of the red and green sub-pixels may be unnecessarily increased in accordance with the sizes of the blue sub-pixel and the light-emitting portion. In this case, a light-emitting region of each sub-pixel for forming a color may be reduced due to an unnecessary space for a capacitor, and thus an aperture ratio may relatively reduced, and brightness may be poorer.

According to the embodiments, the storage capacitor Cst_B of the blue (B) sub-pixel extends into the red (R) sub-pixel or the green (G) sub-pixel, and thus the area of the light emitting portion EL_B of the blue sub-pixel of the organic light emitting display may be increased, thereby effectively enhancing an aperture ratio, and accordingly, achieving a more reliable product when the organic light-emitting display device is employed.

The above-described organic light-emitting display device and method of manufacturing the organic light-emitting display device may improve a structure of a capacitor and enhance an aperture ratio, thereby providing a more reliable product when the organic light-emitting display device is employed.

While the embodiments have been particularly shown and described with reference to exemplary embodiments thereof, it will be understood by those of ordinary skill in the art that various changes in form and details may be made therein without departing from the spirit and scope thereof as defined by the following claims.

What is claimed is:

1. An organic light-emitting display device, comprising:
a plurality of sub-pixels each comprising a light-emitting portion, a thin film transistor (TFT), and a capacitor, each of the sub-pixels emitting a different color,
wherein the capacitor of at least one of the plurality of sub-pixels extends into at least one adjacent one of the sub-pixels.

2. The organic light-emitting display device of claim 1, wherein the plurality of sub-pixels includes a red sub-pixel, a blue sub-pixel, and a green sub-pixel.

3. The organic light-emitting display device of claim 2, wherein the capacitor of the blue sub-pixel extends into at least one of the red sub-pixel and the green sub-pixel.

4. The organic light-emitting display device of claim 3, wherein:
the capacitor of each of the plurality of sub-pixels includes a first electrode and a second electrode facing each other,
the second electrode of the capacitor of each of the plurality of sub-pixels is formed in each sub-pixel, and
the first electrode of the blue sub-pixel extends into said at least one of the red sub-pixel and the green sub-pixel.

5. The organic light-emitting display device of claim 4, wherein:

the first electrode includes a polycrystalline silicon material, and the second electrode includes at least one of ITO, IZO, ZnO, $In_2O_3$, IGO, and AZO.

6. The organic light-emitting display device of claim 4, wherein the first electrode of the blue sub-pixel includes a first facing portion facing the second electrode of the blue sub-pixel, a second facing portion facing the second electrode of said at least one of the red sub-pixel and the green sub-pixel, and a connection portion connecting the first facing portion and the second facing portion.

7. The organic light-emitting display device of claim 4, wherein:

the light-emitting portion includes an organic emissive layer (EML), a pixel electrode, and an opposite electrode facing the pixel electrode, the EML being interposed between the pixel electrode and the opposite electrode, and the TFT includes an active layer formed on a same plane as and formed of a same material as the first electrode, a gate electrode formed on a same plane as and formed of a same material as the second electrode, and source and drain electrodes connecting the active layer and the pixel electrode.

8. A method of manufacturing an organic light-emitting display device, the method comprising:

forming a plurality of sub-pixels, each including a light-emitting portion, a TFT, and a capacitor, each of the sub-pixels being configured to emit a different color, wherein the capacitor of at least one of the plurality of sub-pixels is formed to extend into at least one adjacent one of the sub-pixels.

9. The method of claim 8, wherein the plurality of sub-pixels includes a red sub-pixel, a blue sub-pixel, and a green sub-pixel.

10. The method of claim 9, wherein a capacitor of the blue sub-pixel is formed to extend into at least one of the red sub-pixel and the green sub-pixel.

11. The method of claim 10, including forming the capacitor of each of the plurality of sub-pixels to include a first electrode and a second electrode facing each other, wherein the second electrode of the capacitor of each of the plurality of sub-pixels is formed in each sub-pixel, and wherein the first electrode of the blue sub-pixel is formed to extend into said at least one of the red sub-pixel and the green sub-pixel.

12. The method of claim 11, wherein:

the first electrode is formed of a polycrystalline silicon material, and the second electrode includes at least one of ITO, IZO, ZnO, $In_2O_3$, IGO, and AZO.

13. The method of claim 11, including forming the first electrode of the blue sub-pixel to include a first facing portion facing the second electrode of the blue sub-pixel, a second facing portion facing the second electrode of said at least one of the red sub-pixel and the green sub-pixel, and a connection portion connecting the first facing portion and the second facing portion.

14. The method of claim 11, further comprising:

forming an active layer of a same material as the first electrode on a same plane as the first electrode;

forming a gate electrode of a same material as the second electrode on a same plane as the second electrode; and forming source and drain electrodes connecting the active layer and the pixel electrode.

* * * * *